(12) United States Patent
Martines et al.

(10) Patent No.: US 7,139,197 B2
(45) Date of Patent: Nov. 21, 2006

(54) VOLTAGE REGULATION SYSTEM FOR A MULTIWORD PROGRAMMING OF A LOW INTEGRATION AREA NON VOLATILE MEMORY

(75) Inventors: Ignazio Martines, Aci Castello (IT); Massimo Scardaci, Gallipoli (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 222 days.

(21) Appl. No.: 10/789,351

(22) Filed: Feb. 26, 2004

(65) Prior Publication Data
US 2004/0233723 A1 Nov. 25, 2004

(30) Foreign Application Priority Data
Feb. 28, 2003 (EP) .................................. 03425133

(51) Int. Cl.
*G11C 11/34* (2006.01)
(52) U.S. Cl. ..................... 365/185.21; 365/185.18; 365/185.19; 365/189.09
(58) Field of Classification Search ........... 365/185.21, 365/185.18, 185.19, 189.09, 185.09
See application file for complete search history.

(56) References Cited

U.S. PATENT DOCUMENTS

| 5,852,578 | A  | * | 12/1998 | Hoang ................... 365/185.28 |
| 6,292,398 | B1 |   | 9/2001  | Pasotti |
| 6,434,051 | B1 |   | 8/2002  | Endo |
| 6,603,681 | B1 | * | 8/2003  | Micheloni et al. ..... 365/185.19 |
| 2004/0170061 | A1 | * | 9/2004 | Micheloni et al. ..... 365/185.29 |
| 2004/0170062 | A1 | * | 9/2004 | Micheloni et al. ..... 365/185.29 |

OTHER PUBLICATIONS

European Search Report, EP 03 42 5133, dated Jul. 24, 2003.

* cited by examiner

*Primary Examiner*—Richard Elms
*Assistant Examiner*—N Nguyen
(74) *Attorney, Agent, or Firm*—Jenkens & Gilchrist, P.C.

(57) ABSTRACT

The invention relates to a voltage regulation system for multiword programming in non volatile memories, for example of the Flash type, with low circuit area occupation, wherein memories comprise at least a memory cell matrix organized in cell rows and columns and with corresponding circuits responsible for addressing, decoding, reading, writing and erasing the memory cell content. The memory cells have drain terminals connected to matrix columns and are biased in the programming step with a predetermined voltage value by means of program load circuits associated to each matrix column. In parallel with each program load circuit, a conduction-to-ground path is enabled by a controlled active element.

22 Claims, 5 Drawing Sheets

VOLTAGE REGULATION SYSTEM FOR A MULTIWORD PROGRAMMING OF A LOW INTEGRATION AREA NON VOLATILE MEMORY

PRIORITY CLAIM

The present application claims priority from European Patent Application No. 03425133.0 filed Feb. 28, 2003, the disclosure of which is hereby incorporated by reference.

BACKGROUND OF THE INVENTION

1. Technical Field of the Invention

The present invention relates to a voltage regulation system for multiword programming in non volatile memories, for example of the Flash type, with low circuit area occupation. More particularly, but not exclusively, the invention relates to a system as above and wherein memories comprise at least a memory cell matrix organized in cell rows and columns and with corresponding circuits responsible for addressing, decoding, reading, writing and erasing the memory cell content, said cells having drain terminals connected to the matrix columns and biased in the programming step with a predetermined voltage value by means of program load circuits associated to each matrix column.

2. Description of Related Art

It is known that in modern non volatile memories, for example of the Flash EEPROM type, the need to apply very "precise" voltages to memory cells in the writing step is increasingly felt. This is generally valid both for writing cells having a grounded bulk terminal, essentially with Vbulk=0, and for negative Vbulk writing.

In practice, the requirements of the voltage difference Vdrain–Vbulk can be compared to the requirements of the voltage difference Vdrain–Vsource.

The term "precise" actually means the observance of the following requirements: it must be ensured that the flash cell, during the writing operation, operates within an optimum operation window, i.e., within a well defined region of the plane Vdrain vs L, where L is the cell channel length. Such conditions ensure, for example, a threshold jump required to pass from an erased cell to a programmed cell in the required programming time.

The parameter L is clearly a statistically variable within an array or a matrix. The more this parameter is centered around a nominal value, the more the process, through which the cell matrix is formed, is reliable.

The second parameter Vdrain will now be analyzed. The need to fall anyway within the optimum operation window involves a reduced tolerance on Vdrain (Vdrain=Vnom±d %) affecting directly the tolerance allowed for the voltage regulator which must generate the drain voltage.

Actually, in present flash memories it is not just one cell which is written, but rather a number of cells comprised between 1 and 64. When the number of cells to be programmed changes, and thus changes the total load current Iprogram, the drain voltage regulator must supply a regulated voltage allowing each cell to operate within the operation window. Therefore, the aim is to succeed in obtaining Vdrain values which are as stable as possible or as little changed as possible when the number of cells to be programmed changes. Ideally, it should be:

Vgate=constant or identical ramp for each cell and for each programming operation. There are no great problems in complying with this requirement since the regulator operates on the Flash cell gate terminals and thus on a high impedance load;

Vbus1=constant identical for each cell and for each programming operation. There are no great problems in complying with this requirement since the regulator operates on the Flash cell bulk and thus on a high impedance load (if the programming bulk current is disregarded being generally far lower than the drain current);

Vsource=0 for each cell and for each programming operation. At first sight this is not a very relevant requirement, but it requires a good layout routing and a good bias the source lines; and Vdrain=Vnom±d %.

The precision requirement for the voltages involved while programming is even stronger in improved flash devices, as in the case of multilevel flash memories wherein the information to be stored in a cell is no more the one of a single bit (for which it is sufficient to verify if the charge is present/absent on the floating gate) but of a plurality of bits (for which it is necessary to determine indirectly how much charge is present on the floating gate). Inaccuracies on programming voltages contribute to increase the distribution widths of the bits represented by each cell which thus make it difficult or even impossible to determine these levels.

As shown in FIGS. 1 and 2, it is important that the threshold distributions (Vt) of the cells corresponding to the different levels are well spaced from each other in order to make a subsequent sensing easy by using as discriminating voltage (Vr) the voltage in correspondence with the broken lines. Inaccuracies at the programming level would lead the various distributions to get closer to each other and even to cross, thus making a subsequent discriminating operation impossible.

The level distribution in a precise way is a delicate operation which requires a considerable effort as for the memory circuit design. From the physical point of view it is clear that a far lower tolerance on cell parameters is required.

One-to-all/one-to-one regulation. Before facing the regulation problem, it must be immediately said that a design is generally effective if it complies with at least three requirements:

quality;

area occupation; and production or synthesis time.

Actually these parameters are different in importance; the failure of one of them can endanger the whole work. An excellent circuit, synthesized in too long times can become obsolete before it is produced and so on.

The two regulation cases are now described in greater detail. One-to-all regulation is a kind of regulation shown in FIG. 3A. In this case the regulator directly supplies all the cells requiring it (from 1 to Nmax, with Nmax=8–64 or more). The regulator must thus regulate the output of a charge pump, in fact in Flash memories writing voltages are usually obtained internally by means of charge pump positive boosters and with a load varying from:

| Bit no. | Current |
|---|---|
| N=1 | Iprogram |
| Nmax | Nmax * Iprogram |

With a current in the range of 100 uA a load change from 100 uA to 6.4 mA can occur, Vdrain=Vnom±d % having always to be kept.

One-to-one regulation is a kind of regulation shown in FIG. 3B. In this case there is a regulator for each cell to be programmed. The regulator must thus regulate the charge pump output with a load being this time constant.

| Bit no. | Current |
|---------|---------|
| N=1 | Iprogram |

In this case the voltage regulation at the value Vdrain=Vnom±d % is far simpler and more precise. Although advantageous under many aspects, this second method has a serious drawback due to the circuit area occupation required by the regulator. This is one of the factors to which significant attention must be directed in modern memories having an increasingly high integration scale.

There is accordingly a need to provide a voltage regulation system for multiword programming in Flash memories, having such structural and functional characteristics as to require a low circuit area occupation.

SUMMARY OF THE INVENTION

The present invention solves the foregoing and other problems in one embodiment by forming dummy current paths which are parallel-associated with program load circuits and enabled by means of pass transistors, for example with enable signals being complementary to the program enabling signal. Advantageously, load current rushes affecting prior art solutions can be avoided.

An embodiment of the present invention relates to a voltage regulation system for multiword programming in non volatile memories, for example of the Flash type, with low circuit area occupation. The memories comprise at least a memory cell matrix organized in cell rows and columns and with corresponding circuits responsible for addressing, decoding, reading, writing and erasing the memory cell content. Memory cells have drain terminals connected to matrix columns and are biased in the programming step with a predetermined voltage value by means of program load circuits associated to each matrix column. A conduction-to-ground path, enabled by a controlled active element, is provided in parallel with each program load circuit.

In accordance with another embodiment of the invention, a voltage regulation system is provided for a non volatile memory that includes a memory cell matrix organized in cell rows and columns. The system includes a program load circuit for each matrix column that biases each memory cell if the matrix column is selected with a predetermined voltage value during a programming operation. A conduction-to-ground path is provided for each matrix column, and each path is enabled when its associated matrix column is not selected during the programming operation.

In accordance with another embodiment, a non-volatile memory circuit includes a non-volatile memory cell coupled to a bit line and a word line, and a selectively actuated conduction to ground path coupled to the bit line.

In yet another embodiment, a non-volatile memory includes a memory matrix including a plurality of memory cells arranged in columns, each associated with a bit line, and rows, each associated with a word line. A column programming circuit is coupled between a charge source and each bit line and activated in response to a first control signal. A bypass path circuit is provided for each bit line and is coupled between the charge source and ground and activated in response to a second control signal.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

With reference to the figures, a voltage regulation system for multiword programming in low circuit area occupation non volatile memories, for example of the Flash type, is globally and schematically indicated with reference 1.

Non volatile memories are electronic devices integrated on semiconductor and equipped with memory cell matrices, particularly multilevel cells. More particularly, memory device means any monolithic electronic system incorporating a matrix of memory cells 5, organized in rows, referred to as word lines 6, and columns, referred to as bit lines 4, as well as circuit portions associated to the cell matrix and responsible for addressing, decoding, reading, writing and erasing the memory cell content. Such a device can be, for example, a memory chip integrated on semiconductor and of the non volatile EEPROM Flash type split in sectors and electrically erasable.

Each memory cell comprises a floating gate transistor with source S, drain D and control gate G terminals.

Among the circuit portions associated with the cell matrix, a plurality of program load circuits 2 are provided, each circuit being associated to a corresponding matrix column 4 and supplied with a specific supply voltage that is generated in the integrated memory device and regulated by means of a drain voltage Vd regulator in order to apply convenient bias voltages to the cell matrix columns.

Figure 1:
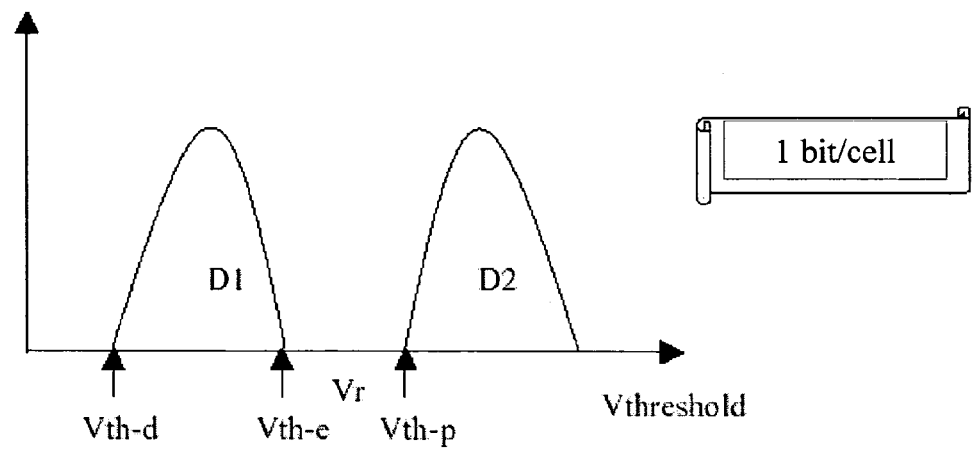
FIG. 1 schematically shows a diagram illustrating the threshold voltage distribution in a conventional one-bit-per-cell memory cell.
Figure 2:
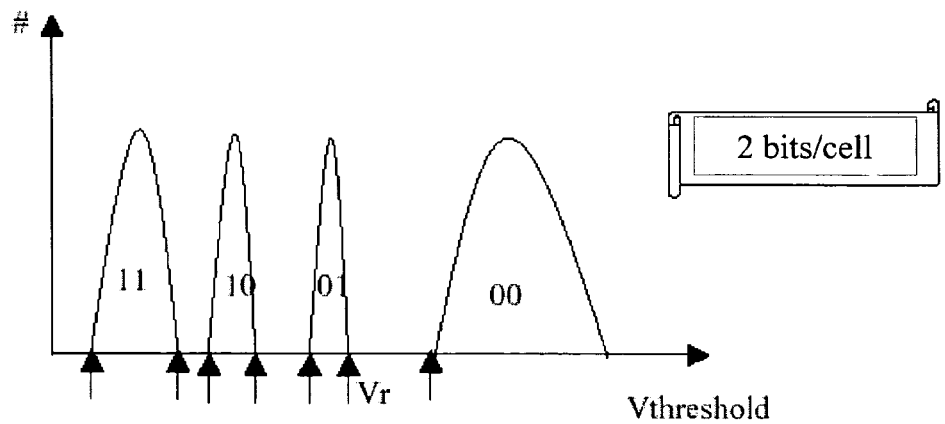
FIG. 2 schematically shows a diagram illustrating the threshold voltage distribution in a two-bit-per-cell multi-level memory cell.
Figure 3A:
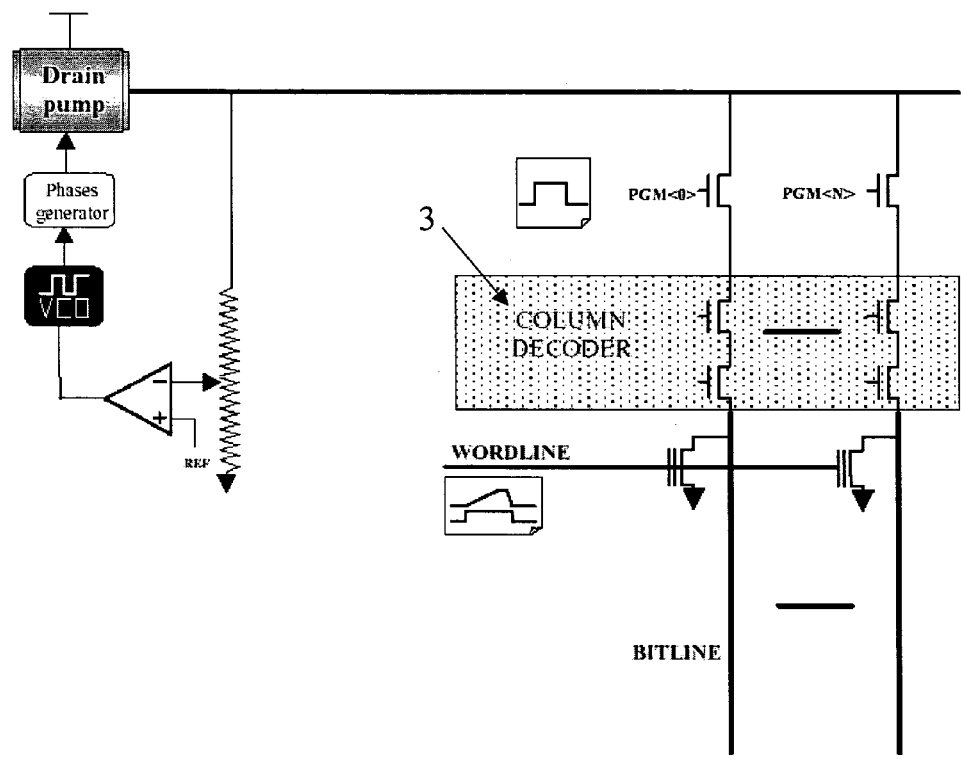
FIGS. 3A and 3B schematically show a portion of a memory cell matrix in a non volatile memory electronic device with an associated column decoder according to the prior art, in the one-to-all and one-to-one regulation cases respectively.
Figure 3B:
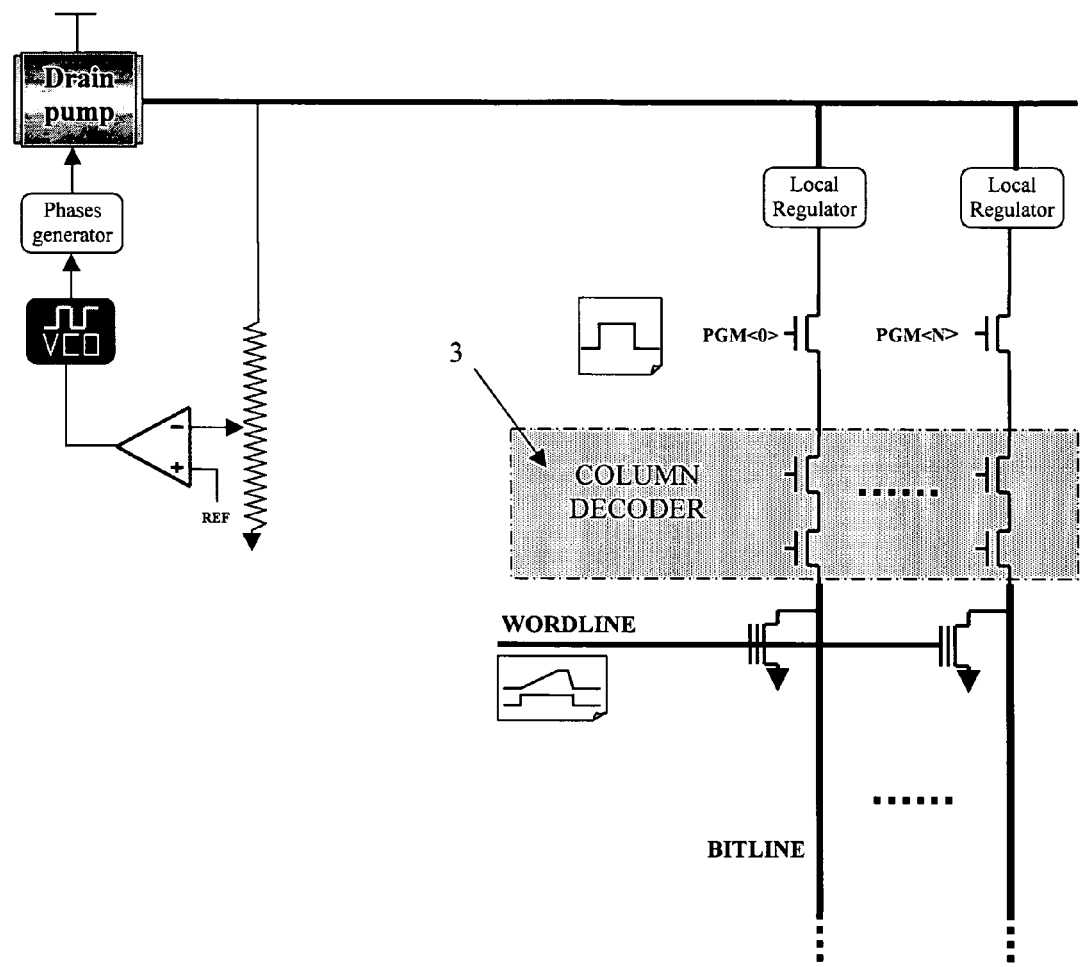
Figure 4:
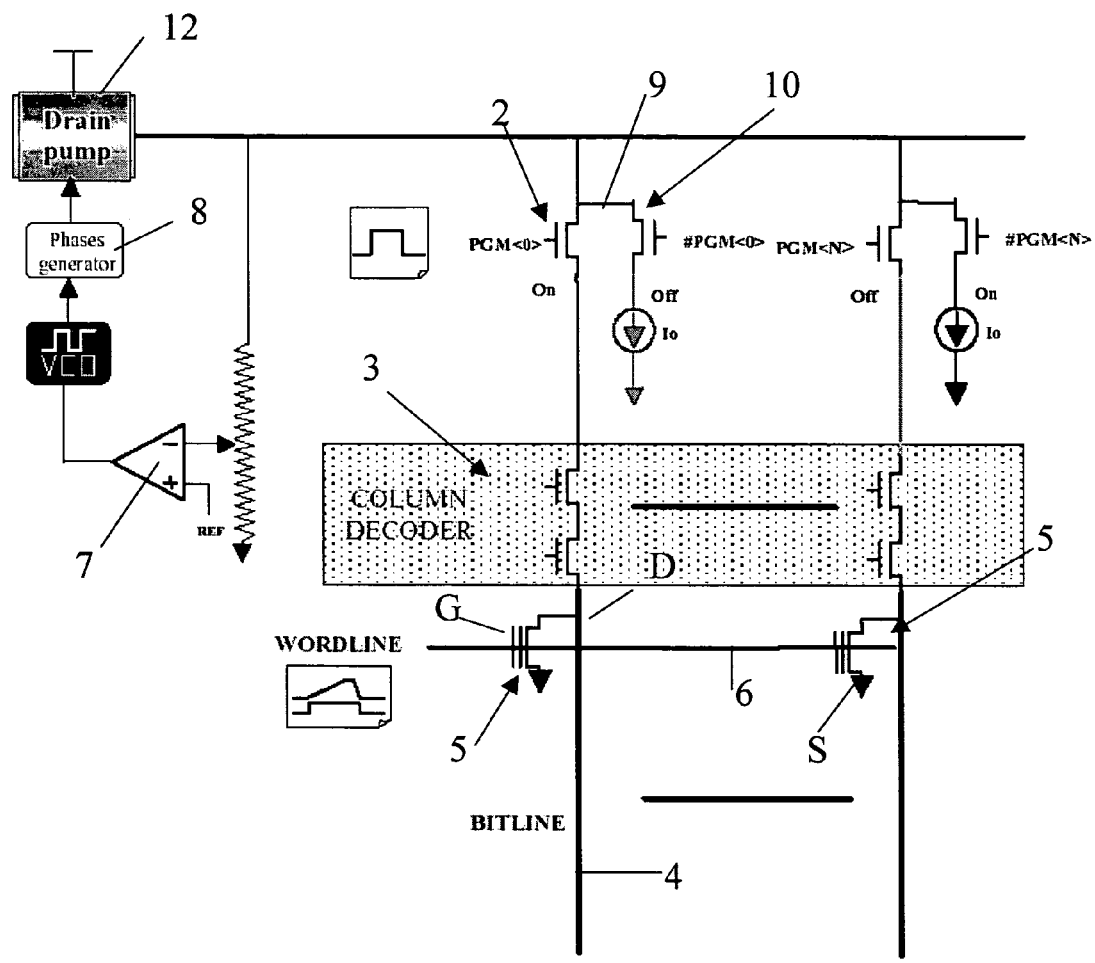
FIG. 4 schematically shows a portion of a memory cell matrix in a non volatile memory electronic device with an associated voltage regulation system according to the invention for the programming step.

Moreover, a column decoder 3 is provided to which the cell matrix columns or bit lines 4 belong. Also, the column decoder 3, located downstream of program load circuits 2, is supplied with specific voltages generated in the integrated memory circuit by means of positive boosters or charge pumps 12 and regulated by means of corresponding voltage regulators. In the example of FIG. 3, the charge pump 12 is regulated by the output of a stable voltage regulator 7 through the series of a voltage-controlled oscillator VCO and a phase generator 8.

The principles of the present invention are specifically exploited to perform a local sector regulation of the drain voltage Vd in the programming step. The voltage applied to the drain terminal D of cells 5 is in fact a parameter which must be controlled with great precision during programming. The principles of the present invention are applied to an integrated memory device wherein the circuit techniques and technological processes used allow an almost constant drain current to be obtained during the whole programming operation.

Advantageously according to the invention, in parallel with each program load circuit 2, a conduction-to-ground path 9, which is enabled by a controlled active element, is provided. The path 9 comprises a pass transistor 10 (the controlled active element) receiving on the control terminal thereof an enabling signal/PGM (wherein "/" designates a complementary signal). The /PGM enabling signal is complementary to the enabling signal PGM that is applied to the corresponding program load circuit 2. The path 9 is essentially a redundant or dummy path. Therefore, the invention provides dummy current paths 9 being parallel-associated with program load circuits 2 and enabled by means of pass transistors 10, for example, with enabling signals being complementary to the program enabling signal.

The current value for the parallel path 9 can thus be easily set, even if its exact value is not important for our application. In this case, this is the regulation of simplest construction since the regulator always operates in a known situation, i.e., as if it were always programming the highest number of cells allowed by the device.

The invention shares the advantages of known solutions but without being affected by the drawbacks thereof. Particularly, the system according to the invention advantageously has a minimum circuit area occupation as in the one-to-all solutions, in fact it requires only the insertion of two transistors for each memory cell branch.

Figure 5:
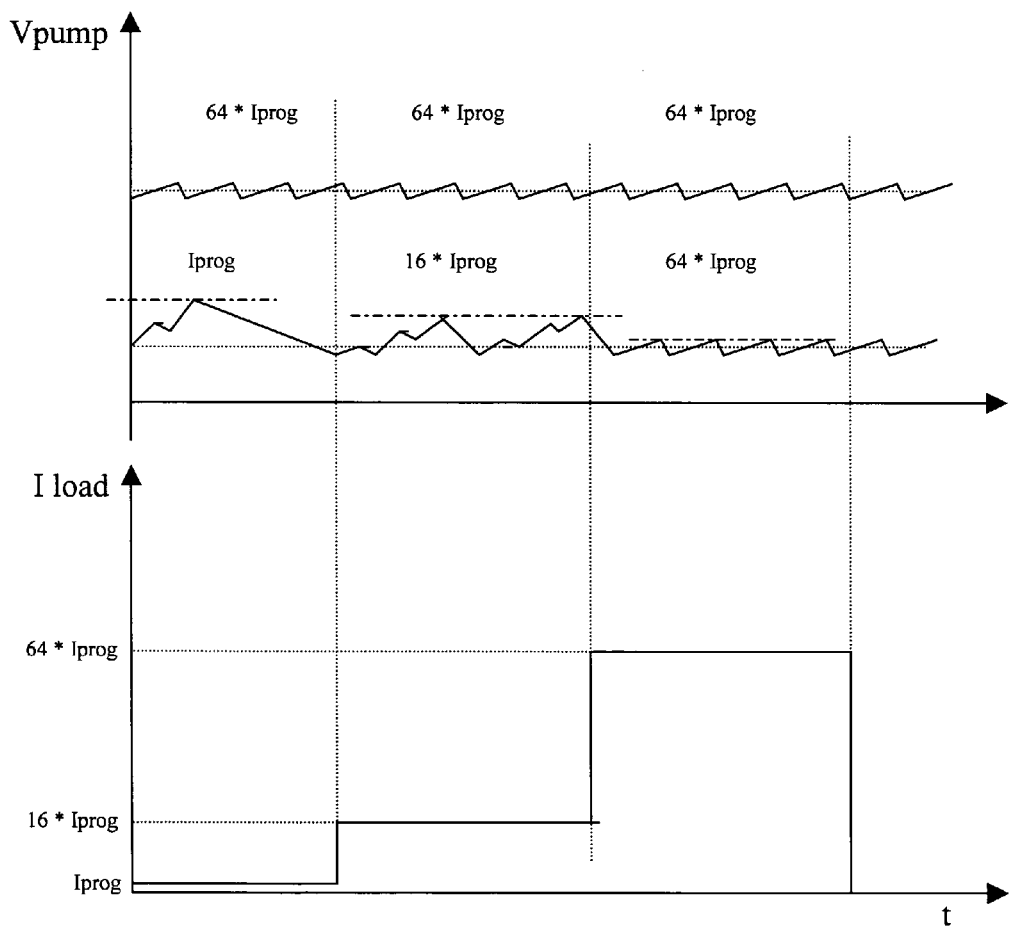
FIG. 5 shows by way of comparison some trends of signals inside regulation systems according to the prior art and to the invention.

The system according to the invention, however, also has the advantage of the one-to-one solution, i.e., it allows a regulation to be performed with almost constant load. Essentially, this system avoids load current rushes affecting prior art solutions. A comparison between the programming voltage ripples of the prior art solution and of the solution according to the invention shows that the ripple is kept low and constant independently from the number of bits to be programmed as shown in FIG. 5.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A voltage regulation system for multiword programming in a non volatile memory, for example of the Flash type, with low circuit area occupation, wherein the memory comprises at least a memory cell matrix organized in cell rows and columns and with corresponding circuits responsible for addressing, decoding, reading, writing and erasing the memory cell content, each cell having a drain terminal connected to a matrix column and biased in the programming step with a predetermined voltage value by a program load circuit associated with each matrix column, the system further including, in parallel with each program load circuit, a current sinking conduction-to-ground path that includes an enabling controlled active element.

2. The system according to claim 1, wherein the controlled active element is a pass transistor receiving on the control terminal thereof a first enabling signal.

3. The system according to claim 2, wherein the first enabling signal is complementary to a second enabling signal applied to the corresponding program load circuit.

4. The system according to claim 1, wherein the conduction-to-ground path is a redundant current path.

5. The system according to claim 1, wherein the conduction-to-ground path is a dummy current path.

6. A non-volatile memory circuit, comprising:
a non-volatile memory cell coupled to a bit line and a word line;
a bit line biasing circuit coupled to the bit line; and
a selectively actuated current sinking conduction to ground path coupled to the bit line in parallel with the bit line biasing circuit.

7. The circuit of claim 6 wherein the non-volatile memory cell comprises a floating gate transistor having its drain terminal connected to the bit line and its gate connected to the word line.

8. The circuit of claim 6 wherein the selectively actuated conduction to ground path is coupled to the bit line through at least a column decoding circuit.

9. The circuit of claim 6 wherein the selectively actuated conduction to ground path is coupled to the bit line through at least a bit line biasing circuit.

10. A non-volatile memory comprising:
a non-volatile memory cell coupled to a bit line and a word line;
a bit line biasing circuit; and
a selectively actuated current sinking conduction to ground path coupled to the bit line through at least a bit line biasing circuit;
wherein the bit line biasing circuit and the selectively actuated conduction to ground path are oppositely activated.

11. A non-volatile memory, comprising:
a memory matrix including a plurality of memory cells arranged in columns, each associated with a bit line, and rows, each associated with a word line;
a column programming circuit coupled between a programming voltage source and each bit line and activated in response to a first control signal; and
a bypass path circuit for each bit line coupled in parallel with the column programming circuit between the programming voltage source and ground and activated in response to a second control signal.

12. The memory of claim 11 wherein each memory cell comprises a floating gate transistor having its drain terminal connected to the bit line and its gate connected to the word line.

13. The memory of claim 11 further including a column decoding circuit for each column.

14. The memory of claim 11 wherein the bypass path circuit comprises a pass transistor for each column coupled between the programming voltage source and ground.

15. A non-volatile memory, comprising:
a memory matrix including a plurality of memory cells arranged in columns, each associated with a bit line, and rows, each associated with a word line;

a column programming circuit coupled between a programming voltage source and each bit line and activated in response to a first control signal; and a bypass path circuit for each bit line coupled between the programming voltage source and ground and activated in response to a second control signal;

wherein, for each column, the first and second control signals are complementary.

16. A voltage regulation system for a non volatile memory including a memory cell matrix organized in cell rows and columns, comprising:

a program load circuit for each matrix column that biases each memory cell in a selected matrix column with a predetermined voltage value during a programming operation; and a current sinking conduction-to-ground path for each matrix column, each path being connected in parallel with the program load circuit and enabled when its associated matrix column is not selected during the programming operation.

17. The system of claim 16 wherein each memory cell comprises a floating gate transistor having its drain terminal connected to a bit line for a column and its gate connected to a word line for a row.

18. The system of claim 16 further including a column decoding circuit for each column.

19. The system according to claim 16, wherein the conduction to ground path includes a controlled active element comprising a pass transistor receiving on a control terminal thereof a first enabling signal.

20. A voltage regulation system for a non volatile memory including a memory cell matrix organized in cell rows and columns, comprising:

a program load circuit for each matrix column that biases each memory cell in a selected matrix column with a predetermined voltage value during a programming operation; and a current sinking conduction-to-ground path for each matrix column, each path being enabled when its associated matrix column is not selected during the programming operation;

wherein the conduction to ground path includes a controlled active element comprising a pass transistor receiving on a control terminal thereof a first enabling signal; and wherein the first enabling signal is complementary to a second enabling signal applied to the corresponding program load circuit.

21. A voltage regulation system for a non volatile memory including a memory cell matrix organized in cell rows and columns, comprising:

a program load circuit for each matrix column that biases each memory cell in a selected matrix column with a predetermined voltage value during a programming operation; and a current sinking conduction-to-ground path for each matrix column, each path being enabled when its associated matrix column is not selected during the programming operation;

wherein the conduction-to-ground path is a redundant current path for the program load circuit.

22. A voltage regulation system for a non volatile memory including a memory cell matrix organized in cell rows and columns, comprising:

a program load circuit for each matrix column that biases each memory cell in a selected matrix column with a predetermined voltage value during a programming operation; and a current sinking conduction-to-ground path for each matrix column, each path being enabled when its associated matrix column is not selected during the programming operation;

wherein the conduction-to-ground path is a dummy current path for the program load circuit.

* * * * *